US010566069B2

(12) United States Patent
Fujii et al.

(10) Patent No.: US 10,566,069 B2
(45) Date of Patent: Feb. 18, 2020

(54) SEMICONDUCTOR APPARATUS, LIQUID DISCHARGE HEAD SUBSTRATE, LIQUID DISCHARGE HEAD, AND LIQUID DISCHARGE APPARATUS

(71) Applicant: CANON KABUSHIKI KAISHA, Tokyo (JP)

(72) Inventors: Kazunari Fujii, Tokyo (JP); Toshio Negishi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 45 days.

(21) Appl. No.: 15/678,860

(22) Filed: Aug. 16, 2017

(65) Prior Publication Data

US 2018/0061506 A1    Mar. 1, 2018

(30) Foreign Application Priority Data

Aug. 31, 2016    (JP) .................. 2016-169617

(51) Int. Cl.

| | |
|---|---|
| *B41J 2/045* | (2006.01) |
| *G11C 17/14* | (2006.01) |
| *G11C 7/04* | (2006.01) |
| *B41J 2/14* | (2006.01) |
| *G11C 17/16* | (2006.01) |
| *B41J 2/175* | (2006.01) |
| *B41J 2/35* | (2006.01) |
| *G11C 17/18* | (2006.01) |
| *H01L 23/525* | (2006.01) |

(52) U.S. Cl.
CPC .......... *G11C 17/146* (2013.01); *B41J 2/0458* (2013.01); *B41J 2/04528* (2013.01); *B41J 2/04541* (2013.01); *B41J 2/04543* (2013.01); *B41J 2/04563* (2013.01); *B41J 2/14153* (2013.01); *B41J 2/175* (2013.01); *B41J 2/35* (2013.01); *G11C 7/04* (2013.01); *G11C 17/16* (2013.01); *G11C 17/18* (2013.01); *H01L 23/5252* (2013.01); *B41J 2202/13* (2013.01)

(58) Field of Classification Search
CPC ....... B41J 2/40; B41J 2/35; B41J 2/175; B41J 2/04541; B41J 2/14153; B41J 2/0458; B41J 2/04543; B41J 2202/13; H04N 1/4005; H05B 37/00
See application file for complete search history.

(56) References Cited

U.S. PATENT DOCUMENTS

| | | | |
|---|---|---|---|
| 9,144,978 B2 | 9/2015 | Ohmura | |
| 2017/0084346 A1* | 3/2017 | Yang | .......... G11C 7/04 |
| 2018/0281390 A1* | 10/2018 | Fujii | .......... B41J 29/38 |

FOREIGN PATENT DOCUMENTS

JP       2014-58130 A    4/2014

* cited by examiner

*Primary Examiner* — Kristal Feggins
(74) *Attorney, Agent, or Firm* — Canon U.S.A., Inc. IP Division

(57) ABSTRACT

A semiconductor apparatus includes a transistor connected to a first potential terminal having a first potential, an anti-fuse element connected between the transistor and a second potential terminal having a second potential, a resistive element connected in parallel with the anti-fuse element between the transistor and the second potential terminal, and a temperature adjustment unit disposed to face the resistive element.

19 Claims, 7 Drawing Sheets

SEMICONDUCTOR APPARATUS, LIQUID DISCHARGE HEAD SUBSTRATE, LIQUID DISCHARGE HEAD, AND LIQUID DISCHARGE APPARATUS

BACKGROUND OF THE INVENTION

Field of the Invention

The aspect of the embodiments relates to a semiconductor apparatus having an anti-fuse element, a liquid discharge head substrate, a liquid discharge head, and a liquid discharge apparatus.

Description of the Related Art

In recent years, a semiconductor apparatus employs a One Time Programmable (OTP) memory for recording product-specific information including chip identification data (ID) and setting parameters after completion of a product. There are two different types of OTP memories: an OTP memory using a fuse element and an OTP memory using an anti-fuse element. Japanese Patent Application Laid-Open No. 2014-58130 discusses a configuration of a conventional technique using an anti-fuse element.

SUMMARY OF THE DISCLOSURE

According to an aspect of the disclosure, a semiconductor apparatus includes a transistor connected to a first potential terminal having a first potential, an anti-fuse element connected between the transistor and a second potential terminal having a second potential, a resistive element connected in parallel with the anti-fuse element between the transistor and the second potential terminal, and a temperature adjustment unit disposed to face the resistive element.

According to another aspect of the disclosure, a semiconductor apparatus includes a transistor having a first terminal and a second terminal, the first terminal being connected to a first potential terminal having a first potential, an anti-fuse element having a third terminal and a fourth terminal, the third terminal being connected to the second terminal, and the fourth terminal being connected to a second potential terminal having a second potential, a resistive element having a fifth terminal and a sixth terminal, the fifth terminal being connected to the third terminal, and the sixth terminal being connected to the fourth terminal, and a conductive layer disposed to overlap with the resistive element in a planar view with respect to a surface of a semiconductor substrate, wherein the transistor, the anti-fuse element, and the resistive element are formed on the surface.

According to yet another aspect of the disclosure, a semiconductor apparatus includes a transistor connected to a first potential terminal having a first potential, an anti-fuse element connected between the transistor and a second potential terminal having a second potential, a resistance portion having a resistive element connected in parallel with the anti-fuse element between the transistor and the second potential terminal, and an adjustment unit configured to reduce a characteristic change of the resistance portion resulting from a characteristic change by a temperature of the resistive element.

Further features of the disclosure will become apparent from the following description of exemplary embodiments with reference to the attached drawings.

DESCRIPTION OF THE EMBODIMENTS

Various exemplary embodiments, features, and aspects of the disclosure will be described in detail below with reference to the drawings.

There is a semiconductor apparatus such as a liquid discharge head substrate having an anti-fuse element as a memory element. In such a semiconductor apparatus, writing and reading may become difficult by the resistance value of a resistor connected in parallel with the anti-fuse element changing with a temperature change by the environment and printing situation.

Figure 1:
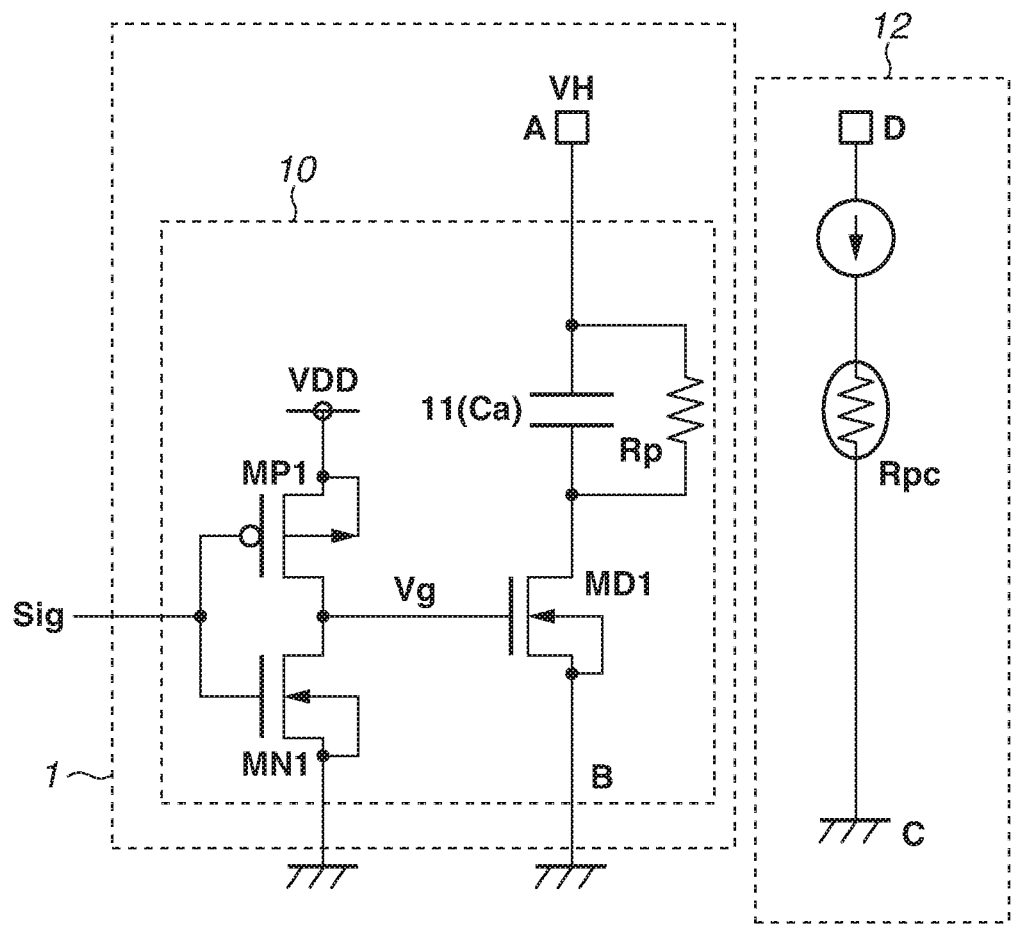
FIG. 1 illustrates a circuit configuration of a semiconductor apparatus according to a first exemplary embodiment.

FIG. 1 illustrates an example of a circuit configuration of a semiconductor apparatus according to a first exemplary embodiment of the disclosure in a state before information is written in the anti-fuse element.

The semiconductor apparatus according to the first exemplary embodiment includes a memory unit 10 and a power supply terminal A (second potential terminal). The memory unit 10 includes a transistor MP1, a transistor MN1, a transistor MD1, an anti-fuse element 11, and a resistive element Rp (resistance portion). According to the present exemplary embodiment, the resistance value of the anti-fuse element 11 changes with an information write operation. The anti-fuse element 11 has a large resistance value before information is written therein. For example, the anti-fuse element 11 functions as a capacitive element Ca before information is written therein. Referring to FIG. 1 illustrating a state before information is written in the anti-fuse element 11, the anti-fuse element 11 is represented by the capacitive element Ca.

When information is written, the resistance value of the anti-fuse element 11 decreases. Therefore, the anti-fuse element 11 functions as a resistive element. Based on a change in the resistance value of the anti-fuse element 11, such a configuration enables reading information written in the anti-fuse element 11. According to the present specification, the resistance value can be calculated as a direct current (DC) resistance.

Referring to FIG. 1, the transistor MP1 is a P-type transistor and the transistor MN1 is an N-type transistor. A control signal Sig is input to the gate terminals of the transistor MP1 and the transistor MN1.

Either one of the source and drain terminals and the back gate terminal of the transistor MP1 are supplied with a power voltage VDD, and the other terminal of the transistor MP1 is connected to either one of the source and drain terminals of the transistor MN1 and to the gate terminal of the transistor MD1. The other terminal and the back gate terminal of the transistor MN1 are connected to the ground wire GND. The transistors MP1 and MN1 form a logic circuit. The withstand voltages of the transistors MP1 and MN1 for forming a logic circuit are lower than the withstand voltage of the transistor MD1 as a high-voltage-proof transistor. Using low-voltage-proof transistors enables high-speed operation of the logic circuit.

The transistor MD1 as a high-voltage-proof transistor controls the voltage application to the anti-fuse element 11. For example, the transistor MD1 may be an N-type Metal Oxide Semiconductor (NMOS) transistor. A high-voltage-proof transistor refers to a transistor having a higher withstand voltage than the withstand voltage of the transistors (transistors MP1 and MN1) used for logic circuits. In one embodiment, a high-voltage-proof transistor is formed not to break down even if the transistor is applied with a high voltage which cannot be withstood by transistors in a general logic circuit such as a control unit.

The anti-fuse element 11 is connected via the transistor MD1 to a power supply terminal B (first potential terminal) supplied with a first potential. As the anti-fuse element 11, for example, an anti-fuse element having a Metal Oxide Semiconductor (MOS) structure can be used. The resistive element Rp is connected to the power supply terminal B having the first potential via the transistor MD1 and is connected in parallel with the anti-fuse element 11. The anti-fuse element 11 and the resistive element Rp are connected to the power supply terminal A supplied with a second potential different from the first potential.

The power supply terminals A and B are pads for electrically connecting the memory unit 10 and external elements and are also terminals for applying a voltage to the anti-fuse element 11. The potential of the power supply terminal B is different from the potential of the power supply terminal A. For example, the potential of the power supply terminal B is a ground potential, and the potential of the power supply terminal A is a high voltage VH (for example, 32V) to be applied when writing information. Referring to FIG. 1, the transistor MD1 is directly connected to the power supply terminal B, and the anti-fuse element 11 is directly connected to the power supply terminal A. However, each of the transistor MD1 and the anti-fuse element 11 may be connected via another electrical element in between as long as the function according to the present exemplary embodiment is not impaired.

As specific connections, either one of the source and drain terminals of the transistor MD1 is connected to one terminal of the anti-fuse element 11 and one terminal of the resistive element Rp. The other terminal of the transistor MD1 is connected to the power supply terminal B set to the ground potential via the ground wire GND. The other terminal of the anti-fuse element 11 is connected with the other terminal of the resistive element Rp, and the two terminals are connected to the power supply terminal A. The transistor MD1 may be, for example, an N-type MOS transistor.

When the transistor MD1 is in the OFF state, the resistive element Rp connected in parallel with the anti-fuse element 11 sets the potentials of one terminal and the other terminal of the capacitive element Ca as the anti-fuse element 11 to almost the same potential.

According to the present exemplary embodiment, the adjustment unit 12 as a temperature adjustment unit can include, for example, a heater Rpc. Referring to FIG. 1, the adjustment unit 12 includes a current source in addition to the heater Rpc. Although, in the present exemplary embodiment, the current source is disposed on a recording element substrate, the disclosure is not limited thereto. The current source may be disposed out of the liquid discharge head substrate. One terminal of the adjustment unit 12 is connected to a power supply terminal C (third potential terminal), and the other terminal thereof is connected to a power supply terminal D (fourth potential terminal). The power supply terminals C and D are pads for electrically connecting the adjustment unit 12 and external elements. The power supply terminal C has the ground potential, and the power supply terminal D has a positive potential.

According to the present exemplary embodiment, the resistive element Rp is a resistance portion. When the current source sends a current to the heater Rpc, the temperature of the heater Rpc changes. This makes it possible to reduce or eliminate a temperature change of the resistive element Rp, thus reducing or eliminating a characteristic change of the resistance portion resulting from a characteristic change of the resistive element Rp due to the temperature. Further, it is possible to dispose a temperature detection unit such as a diode in the vicinity of the resistive element Rp and control the amount of current to be supplied to the heater Rpc while monitoring the output of the temperature detection unit. In this case, the amount of current to be supplied to the heater Rpc is set by a control apparatus disposed out of the liquid discharge head substrate, for example, based on the output from the temperature detection unit.

Disposing the temperature detection unit in the vicinity of the resistive element Rp enables controlling the amount of current to be supplied to the heater Rpc according to a temperature change of the resistive element Rp. In this case, the vicinity of the resistive element Rp includes a position where the temperature of the resistive element Rp can be measured and the position where the temperature of an element for estimating temperature change of the resistive element Rp can be measured by measuring the temperature of a part of an insulator or element in contact with the resistive element Rp.

A write operation will be described below.

When writing information in the anti-fuse element 11, a low-level signal (for example, a signal having the ground potential) as the control signal Sig is input to turn ON the transistor MD1. Thus, the gate insulation film of the anti-fuse element 11 is supplied with the high voltage VH. As a result, a dielectric breakdown occurs in the gate insulation film of the anti-fuse element 11. When a dielectric breakdown of the gate insulation film occurs, the resistance value between the gate terminal of the anti-fuse element 11 and the semiconductor substrate 110 largely decreases. More specifically, the anti-fuse element 11 serves as the capacitive element Ca before writing and serves as a resistive element after writing. Thus, information is written in the anti-fuse element 11.

A read operation will be described below. When reading information from the anti-fuse element 11, a low-level signal (for example, a signal having the ground potential) is input as the control signal Sig corresponding to the anti-fuse element 11 to turn ON the transistor MD1. Measuring the resistance value of the anti-fuse element 11 from a terminal connected to the outside enables reading whether information is written in the anti-fuse element 11.

More specifically, a current is supplied from the outside to the anti-fuse element 11 via the power supply terminal A and the voltage is monitored. In a state where information is not written in the anti-fuse element 11, i.e., when the anti-fuse element 11 serves as the capacitive element Ca, the voltage corresponding to the combined resistance value of the resistance value of the resistive element Rp and the ON-resistance value of the transistor MD1 is read. According to the present exemplary embodiment, the ON-resistance value of the transistor MD1 is smaller than the resistance value of the resistive element Rp. Therefore, the potential of the power supply terminal A is higher than the potential of the power supply terminal B by the voltage drop across the resistive element Rp by a current supplied from the outside.

On the other hand, in a state where information is written in the anti-fuse element 11, the voltage corresponding to the combined resistance value of the writing state resistance value of the anti-fuse element 11, the resistance value of the resistive element Rp, and the ON-resistance value of the transistor MD1 is read. According to the present exemplary embodiment, the resistance value of the anti-fuse element 11 after writing information is smaller than the resistance value of the resistive element Rp. Therefore, in this case, the combined resistance is almost equal to the sum of the resistance value of the anti-fuse element 11 and the ON-resistance value of the transistor MD1. The potential of the power supply terminal A becomes closer to the potential of the power supply terminal B when the combined resistance value becomes smaller than the resistance value of the resistive element Rp.

In this way, the resistance value of the resistive element Rp is set to be sufficiently higher than the resistance value of the anti-fuse element 11 after writing information. Thus, the voltage difference between a case where information is written in the anti-fuse element 11 and a case where information is not written therein can be made large enough to determine whether information has been written.

Information is written in the anti-fuse element 11, for example, by using an inspection machine at the factory at the time of product shipment. When the anti-fuse element 11 is mounted on the main unit of a product and the user writes information in the anti-fuse element 11 after starting the use of the product, the anti-fuse element 11 is supplied with a voltage equivalent to the high voltage VH from the main unit of the product.

In one embodiment, to obtain a large difference in resistance value before and after writing information, the resistance value of the resistive element Rp is several tens of kilo-ohms or larger. For example, a diffused resistor using diffusion can be used as a high-resistance element. However, the diffused resistor Rp has a resistance value which largely changes with the temperature and a temperature coefficient of resistivity of 1,000 ppm/degree or larger. For example, when the temperature coefficient of resistivity of the resistive element Rp is 4,000 ppm/degree, the resistance value of the resistive element Rp will change 40 percent if the temperature changes from 0 to 100 degrees. A resistive element having a temperature coefficient of resistivity of 2,000 ppm/degree or larger, i.e., 4,000 ppm/degree or larger can be used as the diffused resistor Rp.

Before writing information, the resistance value of the resistive element Rp becomes dominant in the resistance values of the anti-fuse element 11 and the resistive element Rp. Therefore, the resistance value in a state where information is not written in the anti-fuse element 11 will change with the temperature. As described above, the difference in the read potential between a case where information is written and a case information is not written changes according to the resistance value of the resistive element Rp. Therefore, when the resistance value of the resistive element Rp largely changes, it may become difficult to correctly write or read information.

For example, when writing information, the transistor MD1 corresponding to the writing target anti-fuse element 11 is turned ON and then OFF. In this case, the transient response of the application voltage to the anti-fuse element 11 is determined as resistance values of the anti-fuse element 11, the resistive element Rp, and the transistor MD1 and the capacitance value of the capacitive element Ca. When the resistance value of the resistive element Rp largely changes, the voltage application characteristics when wiring information will change, making it difficult to stably write information.

When reading information, the voltage corresponding to the combined resistance value of the resistance value of the resistive element Rp and the ON-resistance value of the transistor MD1 will be read before information is written in the anti-fuse element 11. In the read information, therefore, the resistance value of the resistive element Rp becomes dominant. Therefore, when the resistance value of the resistive element Rp largely changes, it becomes difficult to stably read information. To reduce these influences, the adjustment unit 12 is disposed in the vicinity of the resistive element Rp.

The adjustment unit 12 is an element for reducing characteristic change (resistance change) of the resistive element Rp due to the temperature. A heater Rpc illustrated in FIG. 1 is disposed, for example, at a position facing the resistive element Rp. One terminal of the adjustment unit 12 is connected to the power supply terminal C and the other terminal thereof is connected to the power supply terminal D. When the adjustment unit 12 is supplied with a current from a current source disposed inside or outside the semiconductor apparatus, the heater Rpc generates heat to enable controlling the temperature of the resistive element Rp. The current source for supplying a current to the heater Rpc may be disposed on the substrate on which the semiconductor apparatus is disposed, and may be disposed outside the substrate.

In the present specification, disposing a member A having the longitudinal direction in a certain direction to face a member B means disposing the two members at overlapping positions with an insulator interposed therebetween in a planar view with respect to a plane including the longitudinal direction of the member A.

For example, a diode (not illustrated) is disposed as a temperature detection unit in the vicinity of the resistive element Rp. The amount of current to be supplied to the heater Rpc can be controlled while monitoring the output of the temperature detection unit. The amount of current to be supplied to the heater Rpc based on the monitoring result may be adjusted by an external control unit or by a control unit disposed on the substrate on which the semiconductor apparatus is disposed. In one embodiment, the temperature detection unit is disposed on each resistive element Rp, and at least one semiconductor apparatus may be disposed in the semiconductor apparatus. Further, it is not necessary to monitor the temperature.

Disposing the adjustment unit 12 to perform temperature adjustment enables reducing characteristic change by temperature change of the resistive element Rp and preventing information read and write failures by using the anti-fuse element 11.

The adjustment unit 12 may also perform temperature adjustment of portions which have temperature adjustment on other portions of the semiconductor apparatus. For example, when the semiconductor apparatus is provided with a discharge element for discharging a liquid, the adjustment unit 12 may control the temperature of the discharge element.

Figure 2:
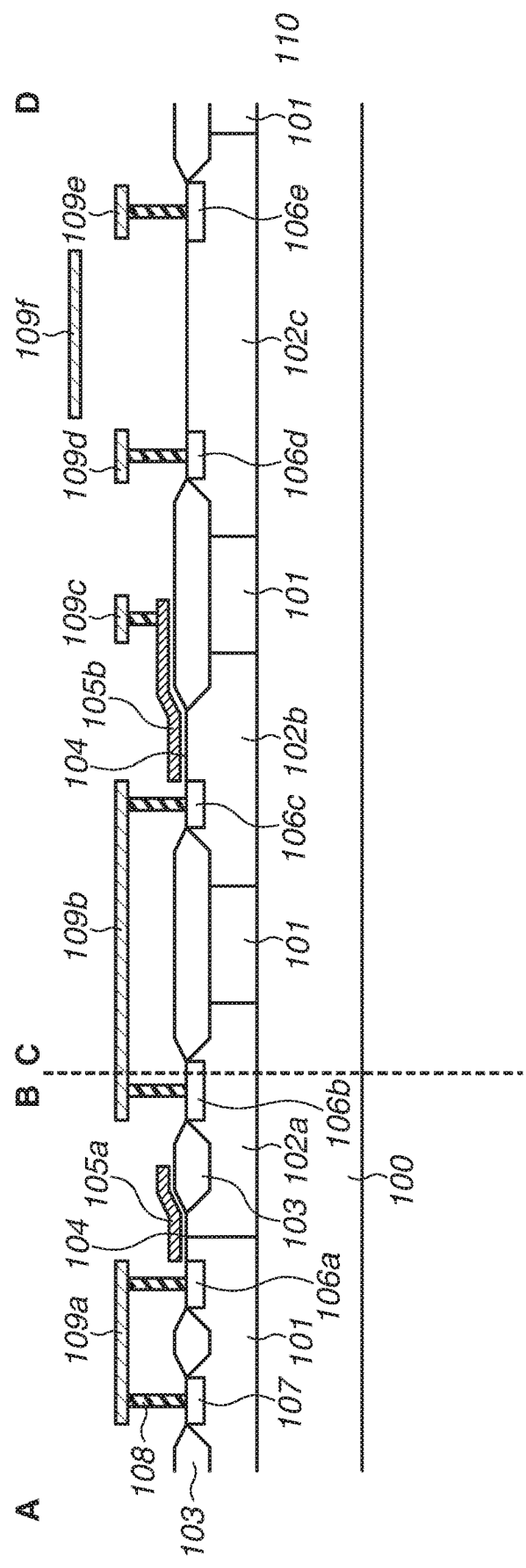
FIG. 2 illustrates a part of a section structure of the semiconductor apparatus.

FIG. 2 illustrates specific examples of section structures of the capacitive element Ca, the resistive element Rp, and the transistor MD1 illustrated in FIG. 1.

In the semiconductor substrate 110, P-well regions 101 and N-well regions 102a, 102b, and 102c are formed on a P-type silicon substrate 100. The P-well regions 101 can be formed in the same process as P-wells of NMOS transistors for forming logic circuits. The N-well regions 102a, 102b, and 102c can be formed in the same process as N-wells of PMOS transistors for forming logic circuits.

With the impurity density of the N-well regions with respect to the P-type silicon substrate 100, the breakdown voltages between the P-type silicon substrate 100 and the N-well regions 102a, 102b, and 102c become higher than the high voltage VH. With the impurity density of the P-well regions 101 and the N-well regions 102a, 102b, and 102c, the breakdown voltages between the P-well region 101 and the N-well regions 102a and 102b become higher than the high voltage VH.

A field oxide film 103, high-density N-type diffusion regions 106a to 106e, and high-density P-type diffusion region 107 are formed on the P-well regions 101 and the N-well regions 102a, 102b, and 102c. The field oxide film 103 can be formed, for example, by using the Local Oxidation of Silicon (LOCOS) method.

The configuration of the transistor MD1 as a high-voltage-proof NMOS transistor will be described below. A gate electrode 105a is disposed on the N-well region 102a and the adjoining P-well region 101 via a gate insulation film 104. The region at which the P-well region 101 overlaps with the gate electrode 105a becomes a channel forming region.

The high-density N-type diffusion region 106a serves as the source of the transistor MD1, and the high-density P-type diffusion region 107 is the back gate electrode thereof. The N-well region 102a has a portion extending to the portion below the gate electrode 105a as an electric field relaxation region of the drain electrode. A high-density N-type diffusion region 106b formed in the N-well region 102a serves as the drain electrode of the transistor MD1. Further, the drain side of the gate electrode 105a is structured to override the field oxide film 103 formed in the N-well region 102 (what is called the LOCOS offset structure).

Thus, even if the voltage of the drain electrode rises to the high voltage VH when the transistor MD1 is OFF, i.e., the voltage of the date electrode is GND, the gate-drain withstand voltage can be ensured.

The structure of the anti-fuse element 11 will be described below. The anti-fuse element 11 has an upper electrode, a lower electrode, and an insulating layer in between. For example, an electrode 105b formed on the N-well region 102b via the gate insulation film 104 functions as the upper electrode of the anti-fuse element 11. A portion of the N-well region 102b connected to a high-density N-type diffusion region 106c and overlaps with the upper electrode in a planar view with respect to a surface of the semiconductor substrate 110 where the transistor MD1 and other elements are disposed functions as the lower electrode. A planar view with respect to a surface where the transistor MD1, the anti-fuse element 11, the resistive element Rp, and other elements are disposed is, for example, a planar view with respect to the front surface of the channel forming region of the transistor MD1.

Referring to FIG. 2, the high-density N-type diffusion region 106c is formed only in the region of the N-well region 102b not overlapping with the upper electrode in a planar view. However, the high-density N-type diffusion region 106c is not limited thereto. For example, the high-density N-type diffusion region 106b may be formed in a part or whole of the portion overlapping with the upper electrode. When the high-density N-type diffusion region 106c is also formed in the region overlapping with the upper electrode in a planar view, the overlapping portion of the high-density N-type diffusion region 106c also function as the lower electrode of the anti-fuse element 11.

Referring to FIG. 1, the lower electrode of the anti-fuse element 11 is connected to the drain terminal of the transistor MD1. However, the upper electrode of the anti-fuse element 11 may be connected to the drain terminal of the third transistor MD1, and the lower electrode may be connected to the high voltage VH.

The gate insulation film 104 can be formed in the process of forming gate insulation films of the transistors MP1 and MN1 for forming a logic circuit. For example, the gate insulation film 104 can be formed with an oxide film. The electrodes 105a and 105b may be, for example, a polysilicon layer. A polysilicon layer, the high-density N-type diffusion regions 106a to 106c, and the high-density P-type diffusion region 107 can be formed in the same process as the process of forming each element of the transistors MP1 and MN1 for forming a low-withstand-voltage logic circuit.

If an anti-fuse element having the MOS structure is used as the anti-fuse element 11 and a MOS transistor is used as a transistor for controlling a write operation on the anti-fuse element 11, the anti-fuse element and the transistor can be formed in the same process. Thus, a semiconductor apparatus can be formed with the small number of processes and low cost.

An insulation film having a plurality of contact portions 108 is formed on the high-density P-type diffusion region 107, the N-type diffusion regions 106a to 106e, and the field oxide film 103. Conductive layers 109a to 109e are formed on the insulation film. An insulation film is formed on the conductive layers 109a to 109e. A conductive layer 109f is further formed on the insulation film. The conductive layers 109a to 109f can be formed of a metal such as aluminum. If the conductive layers 109a to 109f, the electrodes, and the wires are electrically connected, manufacturing methods, materials, and structures are not limited.

FIG. 2 illustrates a capacitive element having the lower and upper electrodes formed of an N-well region and polysilicon, respectively, as an example of the anti-fuse element 11. However, the anti-fuse element 11 is not limited to this structure and may be, for example, a capacitive element using a PMOS transistor. Either one of the upper and lower electrodes of the anti-fuse element 11 functions as one terminal, and the other one of the electrodes thereof functions as the other terminal.

The resistive element Rp having the N-well region 102c as a semiconductor region in the semiconductor substrate 110 is connected to the conductive layers 109d and 109e via the high-density N-type diffusion regions 106d and 106e, respectively. The resistive element Rp is not limited to this structure. For example, a resistor made of a conductive layer or a resistor made of polysilicon may be used as the resistive element Rp.

The heater Rpc as the adjustment unit 12 is the conductive layer 109f as the upper layer of the resistive element Rp. When a current is sent from a current source (not illustrated) to the conductive layer 109f, the temperature of the conductive layer 109f is adjusted. The conductive layer 109f is disposed to face the resistive element Rp via an insulator (2-layer insulation film).

The insulation film is an insulator layer formed on the semiconductor substrate 110 to cover the transistor MD1 and the resistive element Rp. The insulation layer is made of, for example, oxide silicon. The insulation layer is not limited thereto and may be made of silicon nitride or silicon carbide, or may be a stack or mixture layer of these materials. There may be a space instead of an insulation film between the adjustment unit 12 and the resistive element Rp. Referring to FIG. 2, the conductive layer 109f is formed of the same layer as other conductive layers. However, the conductive layer 109f may be formed of a further upper conductive layer, and is not necessarily be disposed right above the resistive element Rp as long as it is in the vicinity of the resistive element Rp.

The conductive layer 109a is connected with the source and back gate terminals of the transistor MD1 via the contact portion 108 and applied with the ground potential. The conductive layer 109b is connected to the drain electrode of the transistor MD1 and the lower electrode of the anti-fuse element 11 via the contact portion 108. The conductive layer 109c is connected to the upper electrode of the anti-fuse element 11 via the contact portion 108 and is applied with the high voltage VH when writing information. The conductive layer 109d is connected with the conductive layer 109c (not illustrated), and the conductive layer 109e is connected with the conductive layer 109b (not illustrated).

Figure 3:
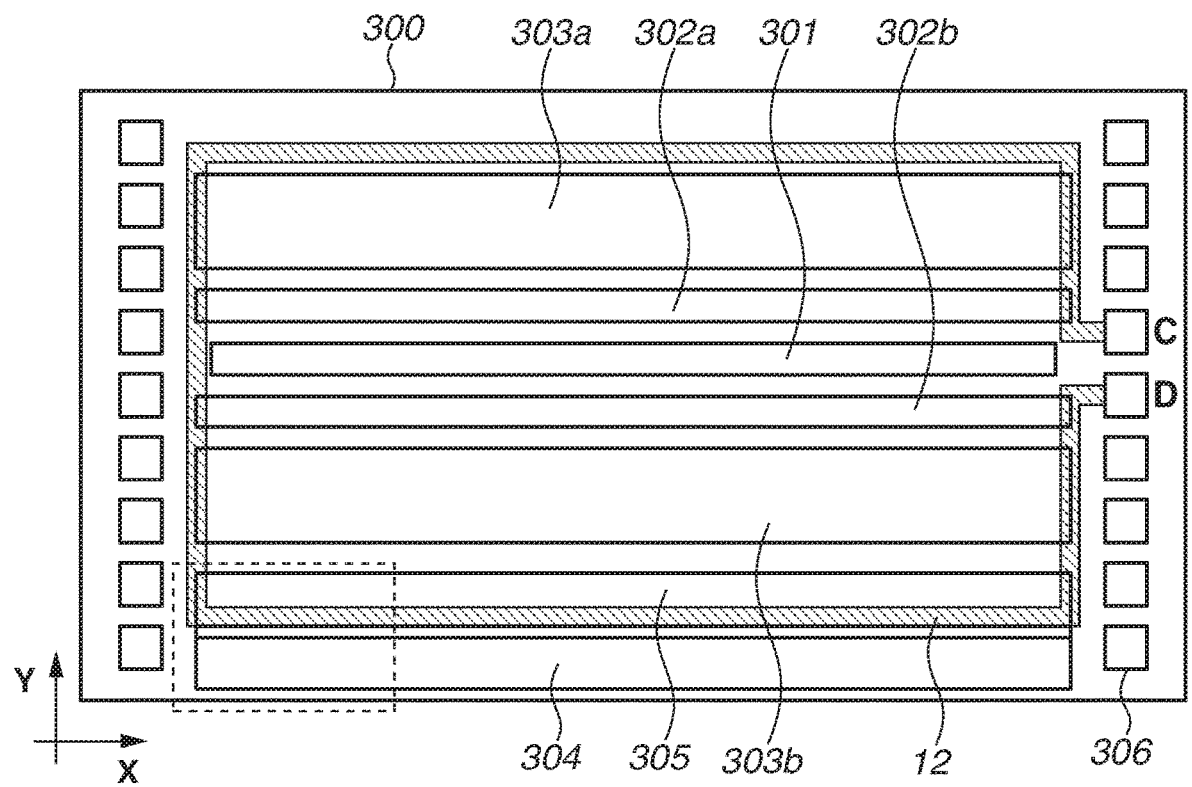
FIG. 3 schematically illustrates a liquid discharge head substrate according to the first exemplary embodiment in a planar view.

FIG. 3 illustrates a concept of the liquid discharge head substrate having the semiconductor apparatus according to the present exemplary embodiment in a planar view with respect to the surface of the semiconductor substrate 110 where elements are formed. A liquid discharge head substrate 300 includes a supply port 301, discharge element groups 302a and 302b having a plurality of discharge elements, drive circuit portions 303a and 303b, an anti-fuse element group 304, and a resistive element group 305.

The supply port 301 extends in the X direction. The discharge element groups 302a and 302b respectively include a plurality of discharge elements arranged in the X direction and are disposed in the Y direction with the supply port 301 in between. The drive circuit portions 303a and 303b respectively include a plurality of drive circuits each of which drives the corresponding discharge elements in the discharge element groups 302a and 302b, respectively. A drive circuit includes, for example, AND circuits and MOS transistors.

The anti-fuse element group 304 is disposed along a side of the semiconductor substrate 110 extending in the X direction. The anti-fuse element group 304 includes a plurality of the anti-fuse elements 11 arranged in the X direction. The resistive element group 305 is disposed between the anti-fuse element group 304 and the drive circuit portion 303b in the Y direction and is connected in parallel with the corresponding anti-fuse. The resistive element group 305 includes a plurality of the resistive elements Rp arranged in the X direction.

A plurality of power supply terminals 306 is disposed along a side of the semiconductor substrate 110 extending in the Y direction. The adjustment unit 12 may be disposed at a position where the temperature of the resistive element Rp can be adjusted, for example, at a position where the adjustment unit 12 overlaps with the resistive element group 305 including a plurality of the resistive elements Rp in a planar view with respect to a surface of the semiconductor substrate 110 where elements are formed. Referring to FIG. 3, the adjustment unit 12 is formed of the conductive layers which are connected to the power supply terminals C and D out of a plurality of the power supply terminals 306 and are disposed along the outer circumference of the semiconductor substrate 110, overlapping with the resistive element group 305 in the planar view.

The adjustment unit 12 has not only a function of adjusting temperature change by the resistive element Rp but also a function of a sub heater for adjusting the temperature of the entire substrate. However, the liquid discharge head substrate according to the present exemplary embodiment is not limited thereto. For example, the adjustment unit 12 may be formed of conductive layers electrically separated from the conductive layers which function as a sub heater.

Figure 4:
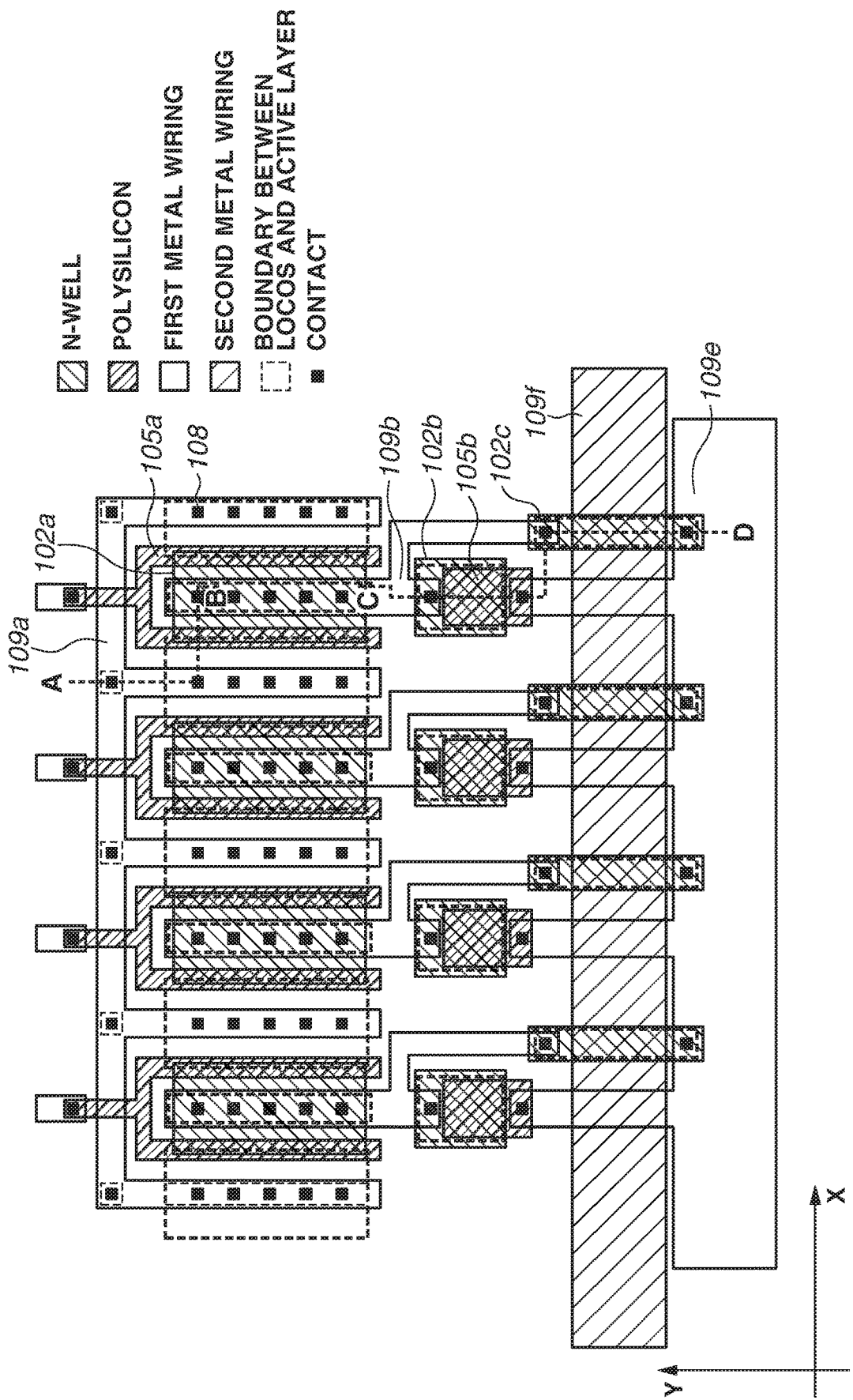
FIG. 4 is a plan view illustrating a part of the liquid discharge head substrate illustrated in FIG. 3.

FIG. 4 is a plan view illustrating in detail a region of a recording head substrate having a semiconductor apparatus drawn by dashed line illustrated in FIG. 3. The sectional view illustrated in FIG. 2 is a sectional view of the semiconductor apparatus in a plane taken along the lines A-B and C-D illustrated in FIG. 4. As illustrated in FIG. 4, the adjustment unit 12 is disposed to overlap with the N-well region 102c of the resistive element Rp in a planar view with respect to a surface of the semiconductor substrate 110 where the transistor MD1, the anti-fuse element 11, the resistive element Rp, and other elements are formed, and to extend in the X direction. The adjustment unit 12 may overlap not only with the N-well region 102e but also with transistor MD1 and the anti-fuse element 11 in a planar view.

A plurality of the resistive elements Rp is arranged in the X direction. On the other hand, the N-well region 102c configuring the resistive element Rp extends in the Y direction. This configuration makes it possible to dispose a plurality of the resistive elements Rp at short intervals. In one embodiment, the transistor MD1 has a large channel width to send a large current, and the transistor MD1 is formed so that the channel width extends in the Y direction. The channel width extending in the Y direction enables disposing a plurality of the transistors MD1 at short intervals. This configuration enables suitably adjusting the resistance value of the resistive element Rp and the channel width of the transistor MD1 while restricting the increase in size of the liquid discharge substrate in the X direction.

For example, a memory mechanism including the transistor MD1, the anti-fuse element 11, and the resistive element Rp can be disposed at a position corresponding to the Y direction with respect to a discharge mechanism having a discharge element and a drive circuit corresponding to the discharge element. Pairs of the above-described discharge mechanism and memory mechanism are arranged in the X direction. In this case, as described above, the resistive elements Rp and the transistors MD1 are disposed to be arranged at short intervals in the X direction. This prevents the width of the liquid discharge head substrate in the X direction from becoming larger than the width regulated by the discharge mechanism.

The adjustment unit 12 is disposed to overlap with the resistive element Rp in a planar view, temperature variations of a plurality of the resistive elements Rp can be reduced.

Using the adjustment unit 12 according to the present exemplary embodiment enables reducing writing and reading failures of the anti-fuse element 11 as a memory element.

The following illustrates another example for reducing the influence of the temperature characteristics of the resistive element Rp connected in parallel with the anti-fuse element 11 according to the first exemplary embodiment. According to a second exemplary embodiment, a resistance portion has the resistive element Rp and a resistive element Rs connected in series with the resistive element Rp.

Figure 5:
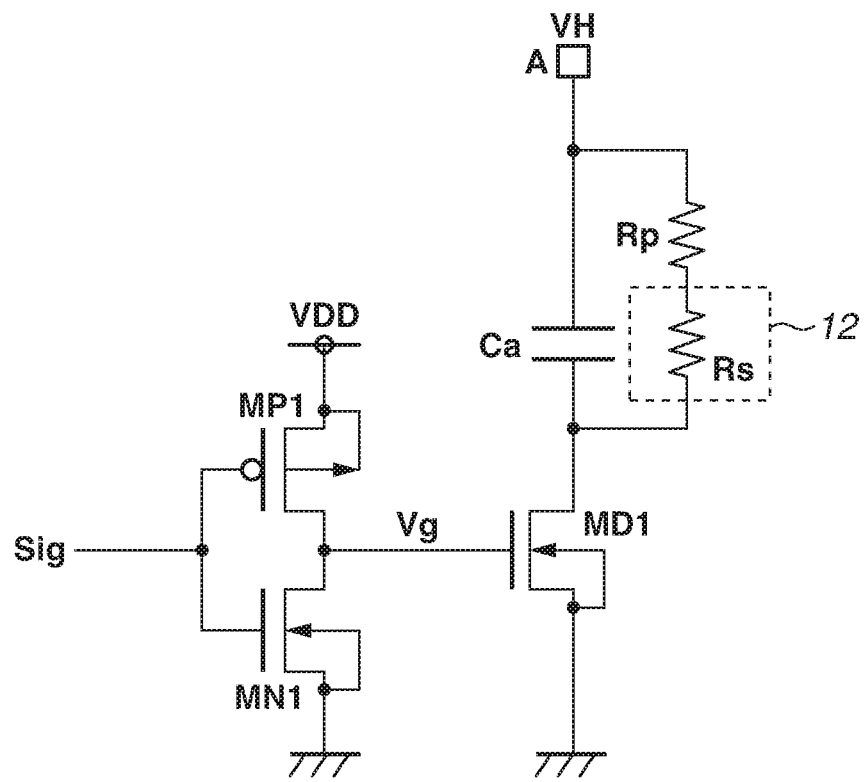
FIG. 5 illustrates a circuit configuration of a semiconductor apparatus according to a second exemplary embodiment.

FIG. 5 illustrates a circuit configuration of a semiconductor apparatus according to the second exemplary embodiment in a state before information is written in the anti-fuse element 11.

The adjustment unit 12 is a resistance adjustment unit according to the present exemplary embodiment. More specifically, the adjustment unit 12 is the resistive element Rs disposed in series with the resistive element Rp which are connected in parallel with the anti-fuse element 11. As illustrated in FIG. 5, according to the present exemplary embodiment, a resistance portion (the resistive element Rp and the resistive element Rs connected in series) and the anti-fuse element 11 are connected in parallel. The resistive element Rs has inverse temperature characteristics of the resistive element Rp in which the absolute values of the temperature coefficients are approximately equal. The temperature characteristics of a resistive element mean the characteristics of a resistance value change in response to a temperature change. The temperature coefficient of the temperature characteristics is the amount of resistance value change with respect to a 1-degree temperature change. The inverse temperature characteristics mean the different sign of the temperature coefficient.

The resistive element Rs is made of polysilicon. Generally with polysilicon, the temperature coefficient can be adjusted by the amount of ion implantation. Disposing in series the resistive element Rs having the inverse temperature characteristics of the resistive element Rp in series enables reducing or eliminating the amount of resistance value change with respect to the temperature of the combined resistance value of the resistive element Rp and the resistive element Rs. More specifically, a characteristic change of the resistance portion resulting from a temperature change of the resistive element Rp can be reduced or eliminated. This makes it possible to reduce writing and reading failures of the anti-fuse element 11. The adjustment unit 12 according to the present exemplary embodiment disposes the resistive element Rs without function of supplying a current, leading to the simplification of the semiconductor apparatus.

According to the present exemplary embodiment, a polysilicon resistance is used as the resistive element Rs. However, the resistive element Rs is not limited thereto and may be a resistive element having the inverse temperature characteristics of the resistive element Rp, for example, an element having the MOS structure or a diode. In one embodiment, the absolute values of the temperature coefficients of the resistive elements Rs and Rp are equal. Even if these absolute values are not equal, the same effect can be obtained as long as the resistive element Rs has the inverse temperature characteristics of the resistive element Rp.

A third exemplary embodiment will be described below centering on an example in which the semiconductor apparatus according to the first or the second exemplary embodiment is applied to a liquid discharge apparatus.

Figure 6:
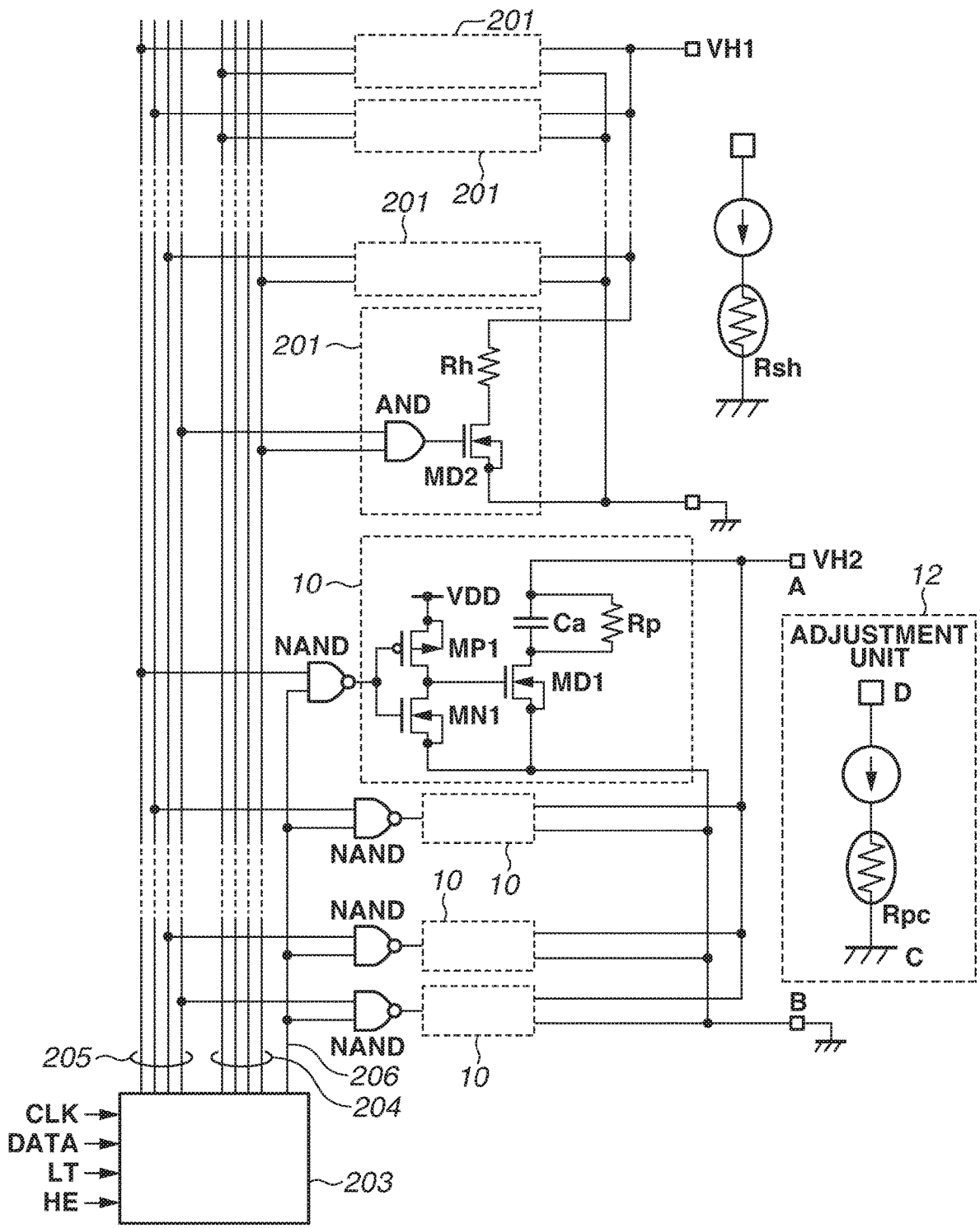
FIG. 6 illustrates a circuit configuration of a liquid discharge head substrate according to a third exemplary embodiment.

FIG. 6 illustrates an example circuit configuration of a liquid discharge head substrate having the semiconductor apparatus (memory unit 10) according to the first or the second exemplary embodiment. The liquid discharge head substrate includes the memory unit 10, NAND logic circuits, and recording units 201.

The memory unit 10 includes an inverter formed of the transistors MP1 and MN1, the transistor MD1, the anti-fuse element Ca, and the resistive element Rp. Each recording unit 201 includes a heater Rh (electrothermal conversion element) as a discharge element and a driver (for example, a transistor MD2 and an AND logic circuit) for driving the heater Rh. Driving the heater Rh, i.e., supplying a current to the heater Rh to generate heat enables discharging a recording material and performing recording.

A control circuit 203 can be formed of, for example, a shift register and a latch circuit (not illustrated). A clock signal CLK, an image data signal DATA, a latch signal LT, and a heater control signal HE may be input to the control circuit 203, for example, via a host personal computer (PC). The AND and NAND logic circuits and the control circuit 203 are supplied with a first power voltage VDD (for example, 3 to 5V) as a power voltage for logic circuits. The recording units 201 and the memory unit 10 are electrically connected to the control circuit 203, respectively.

For m groups each of which includes n recording units 201, for example, the control circuit 203 can perform a time-division drive operation for controlling the operation of the recording units 201 to drive the heater Rh for each group. The time-division drive can be performed when the control circuit 203 outputs an m-bit block selection signal 204 and an n-bit time-division selection signal 205.

When the corresponding block selection signal 204 and the time-division selection signal 205 are input to the AND logic circuit, the transistor MD2 is turned ON to drive the heater Rh connected in series with the transistor MD2. The recording unit 201 is supplied with a second power voltage VH1 (for example, 24V) as a power voltage for driving the heater Rh and is connected to the ground potential GND.

When a control signal 206 and the time-division selection signal 205 are input to the NAND logic circuit, the inverter outputs a signal according to these signals to the transistor MD1 to turn the transistor MD1 ON and OFF. The memory unit 10 is supplied with a third power voltage VH2 for writing information in the anti-fuse element Ca and is connected to the ground potential GND.

To achieve stable liquid discharge, the liquid discharge head substrate has a function of preliminarily heating a heater Rsh for heating the substrate. The temperature of the liquid discharge head substrate is maintained constant by detecting the temperature of the liquid discharge head substrate through a temperature monitor (not illustrated) and sending a current to the heater Rsh.

Meanwhile, there is disposed a separate adjustment unit 12 for adjusting the temperature characteristics of the resistive element Rp connected in parallel with the anti-fuse element 11. In one embodiment, when the recording unit 201 and the memory unit 10 are separately disposed, the adjustment unit 12 is disposed separately. Separately providing the adjustment unit 12 enables adjusting the temperature to different target temperatures, and also enables separately operating the adjustment unit 12 as required, thus saving power. On the other hand, instead of separately using the heater Rsh for heating the substrate and the heater Rpc as the adjustment unit 12, these heaters Rsh and Rpc may be electrically connected and currents to be sent to the heaters Rsh and Rpc from a single current source or terminal may be controlled.

An example of the above-described liquid discharge head substrate mounted on an ink-jet liquid discharge apparatus will be described below with reference to FIGS. 7A, 7B, 7C, and 7D. The form of the liquid discharge apparatus is not limited thereto. For example, a thermal transfer liquid discharge apparatus of the melting or sublimation type is also applicable. The liquid discharge apparatus may be a single function printer having only a recording function or a multifunction printer having a plurality of functions such as a recording function, a FAX function, and a scanner function. The liquid discharge apparatus may also be a manufacturing apparatus for manufacturing color filters, electronic devices, optical devices, or micro structures based on a predetermined recording method.

The term "recording" may include not only a case of forming on a recording medium an image, design, pattern, structure, and other objects actualized to be perceivable by the human vision but also a case of processing a medium. The term "recording medium" may include not only paper used with a common liquid discharge apparatus but also a cloth, plastic film, metal plate, glass, ceramics, resin, wood, leather, and other materials to which a recording agent is applicable. The term "recording agent" may include not only a liquid such as ink to be provided to form an image, design, pattern, etc. or process a recording medium by being applied thereto but also a liquid to be provided to perform processing a recording agent (for example, solidification or insolubilization of a coloring material contained therein).

Figure 7A:
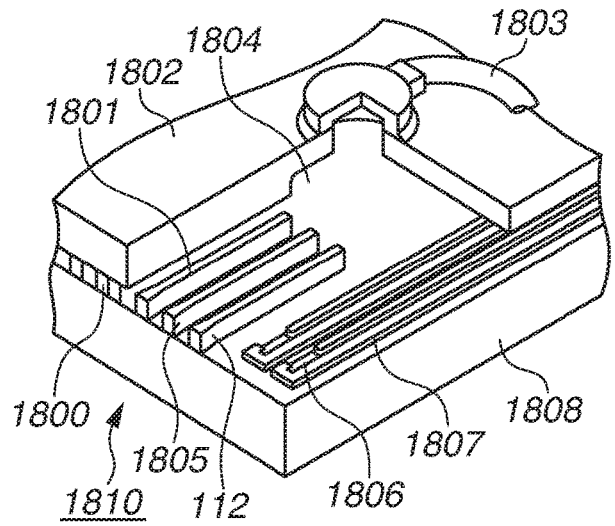
FIGS. 7A, 7B, 7C, and 7D illustrate an example of a liquid discharge apparatus mounting a liquid discharge head substrate.

FIG. 7A illustrates a part of a liquid discharge head 1810. The liquid discharge head 1810 is provided with an ink supply port 1803. A heater according to the above-described exemplary embodiments is illustrated as a heat generation unit 1806. As illustrated in FIG. 7A, the liquid discharge head 1810 is composed of a base 1808, a flow channel wall member 1801 for forming liquid channels 1805 communicating with a plurality of discharge ports 1800, and a top plate 1802 having the ink supply port 1803. The flow channel wall member 1801 and the top plate 1802 are assembled with the base 1808. In this case, ink poured in from the ink supply port 1803 is accumulated in an internal common liquid chamber 1804 and then supplied to the liquid channels 1805. When the base 1808 and the heat generation unit 1806 are driven in this state, ink is discharged from the discharge ports 1800.

Figure 7B:
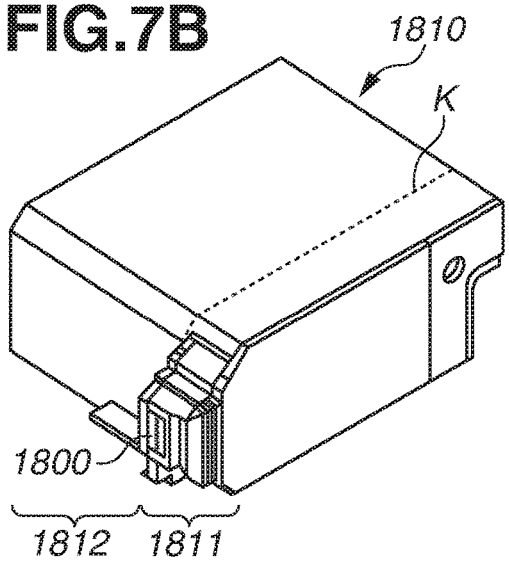

FIG. 7B illustrates an overall configuration of the liquid discharge head 1810. The liquid discharge head 1810 includes a plurality of the discharge ports 1800, a recording unit 1811 having the liquid discharge head substrate 300 according to the first or the second exemplary embodiment, and an ink container 1812 for holding ink to be supplied to the recording unit 1811. The ink container 1812 is detachably attached to the recording unit 1811 with the boundary line K as a boundary. The liquid discharge head 1810 is provided with electrical contacts (not illustrated) for receiving an electrical signal from the carriage side when mounted on the liquid discharge apparatus illustrated in FIG. 7C. The heat generation unit 1806 generates heat based on this electrical signal. The ink container 1812 includes fibrous or porous ink absorbers for holding ink. Ink is held by these ink absorbers.

The liquid discharge head 1810 illustrated in FIG. 7B is attached to the main body of an ink-jet liquid discharge apparatus, and a signal to be applied from the main body to the liquid discharge head 1810 is controlled. This configuration enables providing an ink-jet liquid discharge apparatus capable of achieving high-speed recording and high-definition recording. An ink-jet liquid discharge apparatus using the liquid discharge head 1810 will be described below.

Figure 7C:
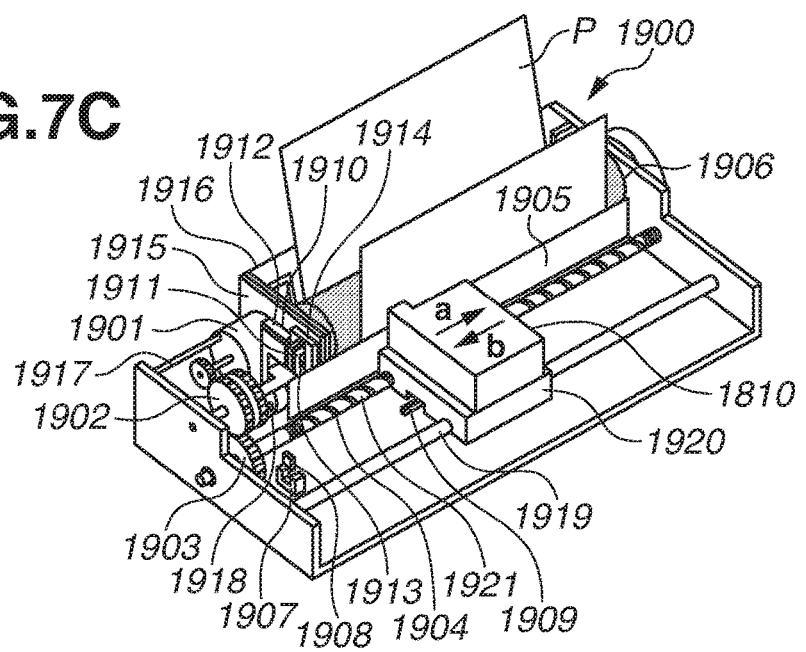

FIG. 7C is a perspective view illustrating the appearance of an ink-jet liquid discharge apparatus 1900 according to an exemplary embodiment of the disclosure. Referring to FIG. 7C, the liquid discharge head 1810 is mounted on a carriage 1920 which engages with a spiral groove 1921 of a lead screw 1904 rotating with the forward and reverse rotations of a drive motor 1901 via driving force transfer gears 1902 and 1903. The above-described configuration allows the liquid discharge head 1810 to reciprocally move in the direction of the arrow a or b along a guide 1919 together with the carriage 1920 by the driving force of the drive motor 1901. A paper pressing plate 1905 for recording paper P conveyed on a platen 1906 by a recording medium feeding apparatus (not illustrated) presses the recording paper P onto the platen 1906 along the moving direction of the carriage 1920.

Photocouplers 1907 and 1908 are home position detection units for checking the existence of a lever 1909 provided on the carriage 1920 in the region where the photocouplers 1907 and 1908 are disposed, and switching the rotational direction of the drive motor 1901. A supporting member 1910 supports a cap member 1911 for capping the entire surface of the liquid discharge head 1810. A suction unit 1912 suctions the inside of the cap member 1911 to perform suction recovery on the liquid discharge head 1810 via an opening 1913 in the cap member 1911. A moving member 1915 allows a cleaning blade 1914 to move back and force. The cleaning blade 1914 and the moving member 1915 are supported by a main body support plate 1916. As the cleaning blade 1914 according to the present exemplary embodiment, a known cleaning blade may be applied instead of the illustrated form. The lever 1917, provided to start the suction for suction recovery, moves with the movement of a cam 1918 engaging with the carriage 1920. The driving force from the drive motor 1901 is controlled by a known transmission unit such as a clutch changeover. The main body of the apparatus is provided with a recording control unit (not illustrated) for supplying a signal to the heat generation unit 1806 disposed on the liquid discharge head 1810 and managing drive control of the drive motor 1901 and other mechanisms.

In the ink-jet liquid discharge apparatus 1900 having the above-described configuration, the liquid discharge head 1810 performs recording on the recording paper P, conveyed on the platen 1906 by the recording medium feeding apparatus, while reciprocally moving over the entire width of the recording paper P. Since the liquid discharge head 1810 uses the liquid discharge substrate according to the above-described exemplary embodiments, it becomes possible to achieve both the improvement in ink discharge accuracy and the driving with a low voltage.

Figure 7D:
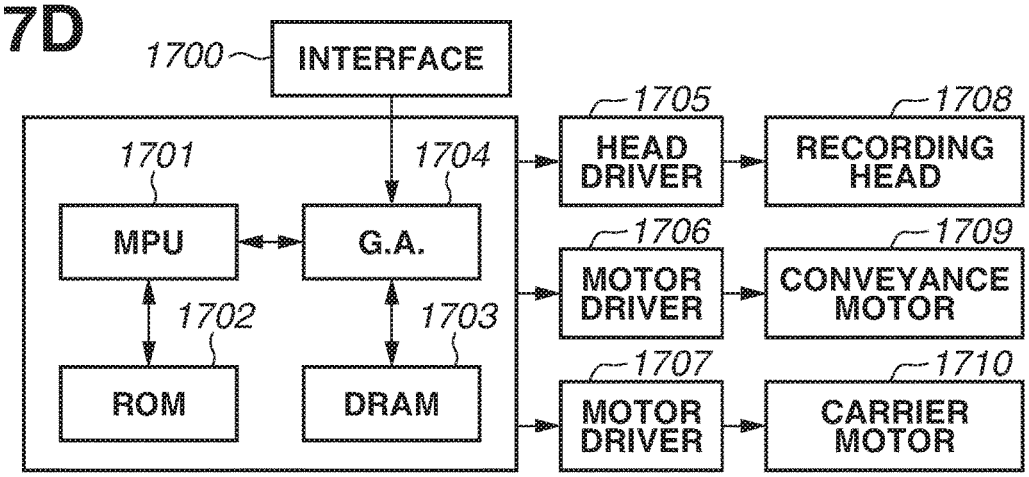

The configuration of the control circuit 203 for performing the above-described recording control on the apparatus. FIG. 7D is a block diagram illustrating the configuration of the control circuit 203 of the ink-jet liquid discharge apparatus 1900. The control circuit 203 includes an interface 1700 for inputting a recording signal, a microprocessor (MPU) 1701, a program read only memory (ROM) 1702, a dynamic random access memory (RAM) 1703, and a gate array 1704. The program ROM 1702 stores a control program executed by the MPU 1701. The dynamic type RAM 1703 stores the above-described recording signals and various data such as recording data to be supplied to the liquid discharge head 1810. The gate array 1704 performs recording data supply control on a liquid discharge head unit 1708. The gate array 1704 also performs data transfer control between the interface 1700, the MPU 1701, and the RAM 1703. The control circuit 203 further includes a carrier motor 1710 for conveying the liquid discharge head unit 1708 and a conveyance motor 1709 for conveying recording paper. The control circuit 203 further includes a head driver 1705 for driving the liquid discharge head unit 1708, and motor drivers 1706 and 1707 for driving the conveyance motor 1709 and the carrier motor 1710, respectively.

Operations of the above-described control configuration will be described below. When a recording signal is input to the interface 1700, the recording signal is converted into recording data for printing between the gate array 1704 and the MPU 1701. When the motor drivers 1706 and 1707 are driven and, at the same time, the liquid discharge head 1810 is driven according to the recording data sent to the head driver 1705, printing is performed.

The above-described liquid discharge apparatus 1900 having three-dimensional (3D) data can be used as an apparatus for forming a three-dimensional image.

Applying the semiconductor apparatus according to the first or the second exemplary embodiment to a liquid discharge apparatus in this way makes is possible to reduce writing and reading failures of an anti-fuse element as a memory element.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-169617, filed Aug. 31, 2016, which is hereby incorporated by reference herein in its entirety.

What is claimed is:

1. A semiconductor apparatus comprising:
   a transistor connected to a first potential terminal having a first potential;
   an anti-fuse element connected between the transistor and a second potential terminal having a second potential;
   a resistive element connected in parallel with the anti-fuse element between the transistor and the second potential terminal; and
   a temperature adjustment unit disposed to face the resistive element.

2. The semiconductor apparatus according to claim 1,
   wherein the temperature adjustment unit overlaps with the resistive element in a planar view with respect to a surface of a semiconductor substrate, and
   wherein the transistor, the anti-fuse element, and the resistive element are formed on the surface.

3. The semiconductor apparatus according to claim 1, wherein the temperature adjustment unit is a heater.

4. The semiconductor apparatus according to claim 1, wherein the temperature adjustment unit is a conductive layer.

5. The semiconductor apparatus according to claim 4,
   wherein the semiconductor apparatus comprises the resistive elements,
   wherein the resistive elements are disposed in a first direction, each of the resistive elements having a shape extending in a second direction intersecting with the first direction,
   wherein the conductive layer has a shape overlapping with the resistive elements in a planar view with respect to a surface of a semiconductor substrate, and extending in the first direction, and
   wherein the transistor is disposed on the surface.

6. The semiconductor apparatus according to claim 1, wherein a temperature detection unit is provided in the vicinity of the resistive element.

7. The semiconductor apparatus according to claim 1, wherein a temperature coefficient of resistivity of the resistive element is 2,000 parts per million (ppm)/degree or higher.

8. A semiconductor apparatus comprising:
   a transistor having a first terminal and a second terminal, the first terminal being connected to a first potential terminal having a first potential;
   an anti-fuse element having a third terminal and a fourth terminal, the third terminal being connected to the second terminal, and the fourth terminal being connected to a second potential terminal having a second potential;
   a resistive element having a fifth terminal and a sixth terminal, the fifth terminal being connected to the third terminal, and the sixth terminal being connected to the fourth terminal; and
   a conductive layer disposed to overlap with the resistive element in a planar view with respect to a surface of a semiconductor substrate,
   wherein the transistor, the anti-fuse element, and the resistive element are formed on the surface.

9. The semiconductor apparatus according to claim 8,
   wherein the semiconductor apparatus comprises the resistive elements,
   wherein the resistive elements are disposed in a first direction, each of the resistive elements having a shape extending in a second direction intersecting with the first direction, and
   wherein the conductive layer has a shape overlapping with the resistive elements in a planar view with respect to the surface of a semiconductor substrate, and extending in the first direction.

10. The semiconductor apparatus according to claim 8, wherein a conductive layer is provided in the vicinity of the resistive element.

11. The semiconductor apparatus according to claim 8, wherein a temperature coefficient of resistivity of the resistive element is 2,000 ppm/degree or higher.

12. A semiconductor apparatus comprising:
    a transistor connected to a first potential terminal having a first potential;
    an anti-fuse element connected between the transistor and a second potential terminal having a second potential;
    a resistance portion having a resistive element connected in parallel with the anti-fuse element between the transistor and the second potential terminal; and
    an adjustment unit configured to reduce a characteristic change of the resistance portion resulting from a characteristic change by a temperature of the resistive element.

13. The semiconductor apparatus according to claim 12, wherein the adjustment unit is a conductive layer.

14. The semiconductor apparatus according to claim 13,
    wherein the semiconductor apparatus comprises resistive elements,
    wherein the resistive elements are disposed in a first direction, each of the resistive elements having a shape extending in a second direction intersecting with the first direction, and
    wherein the conductive layer has a shape overlapping with the resistive elements in a planar view with respect to a surface of a semiconductor substrate where the transistor is disposed, and extending in the first direction.

15. The semiconductor apparatus according to claim 12, wherein a temperature detection unit is provided in the vicinity of the resistive element.

16. The semiconductor apparatus according to claim 12, wherein a temperature coefficient of resistivity of the resistive element is 2,000 ppm/degree or higher.

17. A liquid discharge head substrate comprising:
    discharge elements configured to discharge a liquid;
    a control circuit connected with the discharge elements; and
    the semiconductor apparatus according to claim 12 connected with the control circuit.

18. A liquid discharge head comprising:
a recording unit; and
an ink container attached to the recording unit,
wherein the recording unit includes:
the liquid discharge head substrate according to claim 17; and
discharge ports, each being disposed to correspond to a different one of the discharge elements of the liquid discharge head substrate.

19. A liquid discharge apparatus comprising:
the liquid discharge head according to claim 18;
a carriage configured to mount the liquid discharge head; and
a guide configured to move the carriage.

* * * * *